US011200797B2

(12) United States Patent
Bernet

(10) Patent No.: US 11,200,797 B2
(45) Date of Patent: Dec. 14, 2021

(54) TRAFFIC FLOW SIMULATOR

(71) Applicant: Aurelius Bernet, Zürich (CH)

(72) Inventor: Aurelius Bernet, Zürich (CH)

( * ) Notice: Subject to any disclaimer, the term of this patent is extended or adjusted under 35 U.S.C. 154(b) by 121 days.

(21) Appl. No.: 15/929,145

(22) Filed: Aug. 13, 2019

(65) Prior Publication Data

US 2020/0082711 A1    Mar. 12, 2020

(30) Foreign Application Priority Data

Aug. 15, 2018  (EP) .................................... 18189134

(51) Int. Cl.
  *G08G 1/01*    (2006.01)
  *G06F 30/20*   (2020.01)
  *G08G 1/08*    (2006.01)

(52) U.S. Cl.
  CPC .......... *G08G 1/0125* (2013.01); *G06F 30/20* (2020.01); *G08G 1/0137* (2013.01); *G08G 1/08* (2013.01)

(58) Field of Classification Search
  CPC ...... G08G 1/0125; G08G 1/0137; G08G 1/08; G08G 1/096805; G08G 1/0145; G08G 1/0133; G08G 1/082; G08G 1/00; G08G 1/01; G08G 1/0112; G06F 30/20; G01C 21/3492
  See application file for complete search history.

(56) References Cited

U.S. PATENT DOCUMENTS

2014/0114885 A1\* 4/2014 Han ........................ G06N 20/00 706/12
2015/0360688 A1\* 12/2015 Tanaka ............... G01C 21/3469 701/93

FOREIGN PATENT DOCUMENTS

| DE | 102013204424 A1 * | 9/2014 | ............. G09B 25/04 |
| DE | 102013204424 A1   | 9/2014 | |
| DE | 102015226224 B3 * | 5/2017 | ........... G08G 1/0116 |
| DE | 102015226224 B3   | 5/2017 | |

\* cited by examiner

*Primary Examiner* — Christian Chace
*Assistant Examiner* — Jordan S Fei
(74) *Attorney, Agent, or Firm* — Oppedahl Patent Law Firm LLC

(57) ABSTRACT

A simulation device that on the basis of:
  a traffic network (10) as a graph of route sections (3) and nodes (4),
  with starting places (1) and destinations (2).
so as to determine the traffic volume on the route sections (3) performs the following steps:
  for each starting place (1) and for each of a multiplicity of traffic participants of the starting place (1):
    determining allocated to each of the destinations (2) respectively a traffic participant fraction, corresponding to an allocation of the traffic participants to the destinations;
    determining allocated to each of the destinations (2) respectively an optimal route (6) from the starting place (1) to the destination (2);
    determining for each of the destinations (2) and for each route section (3) of the optimal route (6) a dwell portion (5) of the traffic participant in the route section (3) as a function of the traffic participant fraction that is allocated to this destination (2);
  for each of the route sections (3) of the traffic network (10):
    determining the traffic volume on the route section (3) by means of summating the dwell portions (5) of all traffic participants in this route section (3).

18 Claims, 5 Drawing Sheets

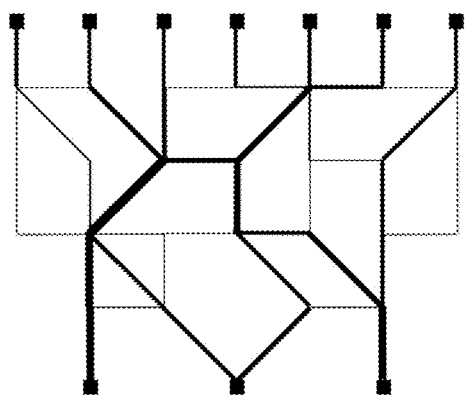
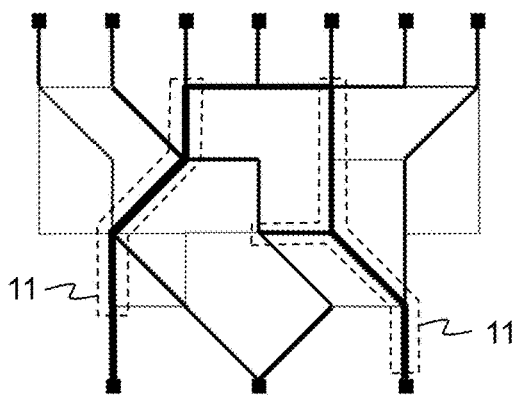
Fig. 5             Fig. 6
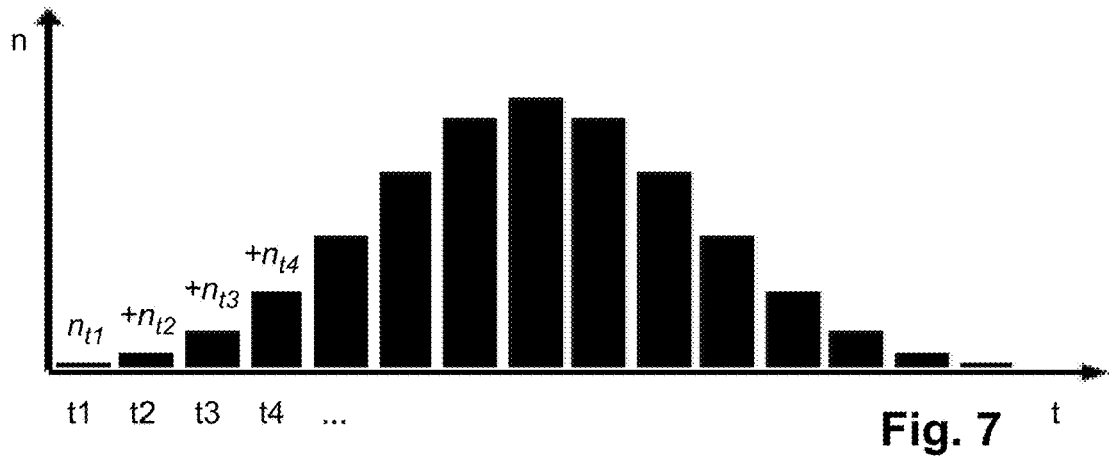
Fig. 7
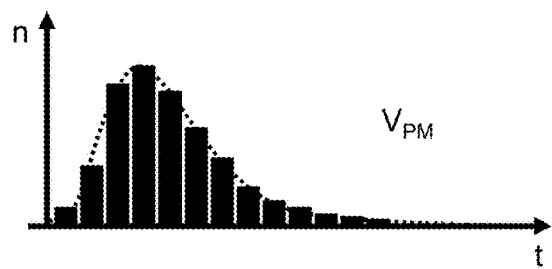
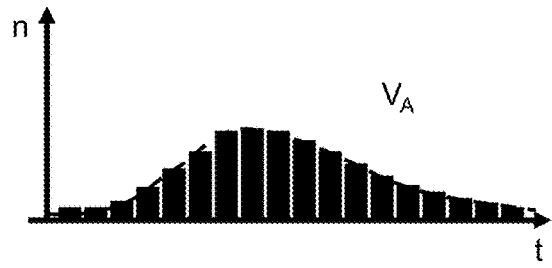
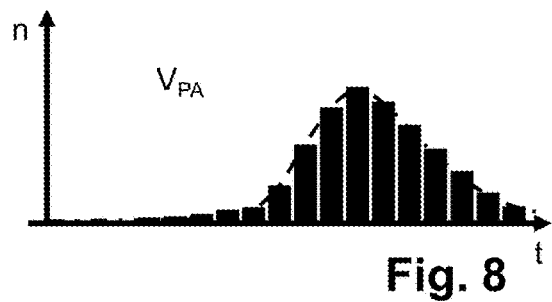
Fig. 8
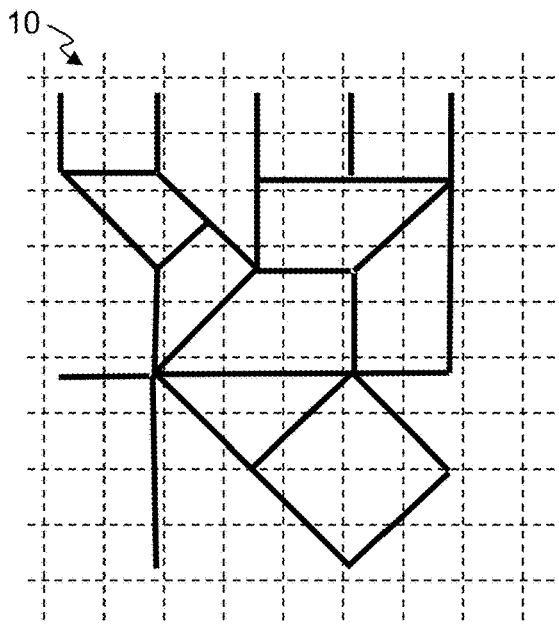
Fig. 9

TRAFFIC FLOW SIMULATOR

The invention relates to the field of simulating traffic flows and in particular to a device, a method, a data processing system and a computer program for traffic flow simulation in accordance with the preamble of the corresponding independent claims.

Traffic flow analyses can be performed at different scales. For this purpose, different traffic models are available that are based on different approaches and are applied to traffic systems at different scales. These conventional traffic models are discussed below on a microscopic, macroscopic and mesoscopic level.

It is a common aspect of all conventional traffic models or traffic simulations that with regard to statements they are dependent upon statistics of traffic counts. Consequently, the results of the conventional traffic simulations always relate to the past.

One of the problems with conventional traffic simulations relates to dividing up the traffic at road junctions or forks in the road. The traffic is divided up on the basis of assumptions. Statistics provided by the traffic counts are used to support these assumptions. Since traffic networks continuously change, be it as a result of the change in a city or the change caused by road works, the assumptions always lag behind in time. If conventional traffic simulations are used in large traffic networks, the results are always distorted.

Microscopic Level

In this traffic model, the vehicles are considered individually. The individual vehicles are modelled as agents that have a specific acceleration behavior, speed behavior and braking behavior. An agent in a software system comprises equations that reflect the behavior of a single individual, in this case a traffic participant. These models are called agent-based traffic models.

In contrast to other types of traffic modeling, the agent-based modeling method involves numerous individual traffic participants who as individual units have decision-making options or possibilities for actions. The system behavior results from the behavior of the individual agents.

It is possible using these models to provide statements, for example as to how traffic congestion forms, on the basis of specific behavior of the traffic participants. This type of traffic modeling is used above all when the focus of a question relates to a limited area.

Macroscopic Level

In a similar manner to models used in fluid dynamics, partial differential equations are used for vehicle densities or average speeds. Traffic models that comprise sources and sinks are produced for these traffic simulations. Sources are locations where the traffic is inserted into the traffic model. Sinks are locations in the traffic model where the traffic is removed from the traffic model. Each source is allocated a sink. The traffic numbers for the sources and sinks, or the inserted or removed traffic, respectively, are based on statistics obtained from traffic counts, thus to historical data.

The basis for a traffic model that is used for this purpose is a mathematical graph that comprises links and nodes. The sources and sinks are present at the nodes. In order to be able to calculate the traffic flow, vehicle densities or average speeds on the paths from a source to a sink, the partial differential equations as used in fluid dynamics are used. These calculations are researched in detail for linear equations but comprise numerous gaps for non-linear equations.

Mesoscopic Level

In the case of these traffic flow models, microscopic and macroscopic models are used. The macroscopic models only use the traffic in its bulk, individual drivers/vehicle units are not considered. These models render it possible to provide statements regarding the traffic flow and the traffic density. The microscopic traffic flow models render it possible to consider individual drivers/vehicle units and are able to provide statements regarding the state of the traffic.

Areas of application of these models are for example the provision of statements regarding the formation of traffic congestion in large traffic networks such as the motorway network. However, also in this case the statements can only always be provided on the basis of statistics relating to traffic volume, thus again based on historical data.

Consequently traffic analyses based on these conventional traffic models always only indicate past occurrences or the past occurrences that can be determined.

DE 10 2015 226 224 B3 describes a method for determining the traffic volume in a traffic network as a basis for route planning. The traffic volume is determined in an iterative manner in a simulation in that initially a percentage portion of a traffic flow is routed from starting places to destinations via routes that involve the shortest travel time, and subsequently further portions are routed, wherein when routing each portion respectively the traffic volume that is produced in the simulated traffic network by the already routed portions is taken into consideration. In accordance with DE 10 2015 226 224 B3, the quality of the method is improved in that after all the respective portions have been routed individual portions are removed from the traffic network and routed a second time.

It is therefore object of the invention to provide a method, a data processing system and a computer program for traffic flow simulation of the type mentioned in the introduction, which offer alternatives to the above described approaches.

A method, a data processing system and a computer program for traffic flow simulation having the features of the corresponding independent claims achieve this object.

The method for traffic flow simulation so as to determine a traffic volume on route sections in a traffic network is performed on a digital data processing unit on the basis of:
 a traffic network as a graph of route sections (corresponding to links in the graph) and nodes,
 wherein a first set of nodes are starting places and each starting place is allocated a starting place number of $N\_Si$ traffic participants, and a second set of nodes are destinations.

In this case, the following steps are performed so as to determine the traffic volume on the route sections:
 for each starting place and for each of the $N\_Si$ traffic participants of the starting place:
  determine allocated to each of the destinations respectively a traffic participant fraction, corresponding to an allocation of the traffic participants to the destinations;
  determine allocated to each of the destinations respectively an optimal route from the starting place to the destination;
  determine for each of the destinations and for each route section of the optimal route a dwell portion of the traffic participant in the route section as a function of the traffic participant fraction that is allocated to this destination;
 for each of the route sections of the traffic network:
  determine the traffic volume on the route section by means of summating the dwell portions of all traffic participants in this route section.

Thus, in order to determine the dwell portions in the route sections, an iteration is performed over the starting places, the traffic participants and their fractions, and also over the destinations and the route sections. The procedure of determining the traffic volume thus summates the dwell portions of each of the optimal routes from each of the starting places to each of the destinations.

The optimal route can be determined in accordance with a method known per se according to predeterminable optimization criteria. Such criteria are by way of example the shortest route, shortest travel time, lowest fuel consumption . . . etc.

It is uncertain which destination a traffic participant is traveling to from their starting place and for this reason a procedure of dispersing traffic participants is used in the new method for traffic simulation. Each individual traffic participant from one starting place is divided by the number of possible destinations and a corresponding traffic participant fraction is dispersed over the optimal, in particular shortest, routes to all possible destinations. Multiple destinations are thus allocated to each starting place. It is not predetermined which destination a specific traffic participant is traveling to. Consequently, in contrast to conventional methods, a starting place-destination matrix is not predetermined and used.

Each traffic participant fraction is thus allocated to a destination, and likewise each of the optimal routes is allocated to a destination. Consequently, one traffic participant fraction is also allocated—via the destination—to each optimal route.

A total number of traffic participants of the starting places can be predetermined from an urban statistic. The traffic flows resulting from the method are thus generated using urban statistics and not using traffic statistics! Urban statistics represent by way of example population number, useable areas occupied by buildings for residential homes, retail outlets, places of work, cultural facilities. They define for each of the total number of traffic participants respectively one starting place and also multiple destinations, said traffic participants being divided up between the one starting place and multiple destinations.

In accordance with embodiments, it is the case that the traffic participant fraction that is allocated to a specific destination respectively is equal to a destination weighting factor that is allocated to this destination divided by the number of destinations.

In one embodiment, the traffic participant fraction respectively is equal to a destination weighting factor that is allocated to a destination divided by the number of destinations.

In accordance with embodiments, it is the case that the traffic participant fraction respectively is equal to one divided by the number of destinations.

By way of example, the destination weighting factor is one, in other words all destinations are considered to be of equal importance. In this embodiment, the traffic participant fraction respectively is equal to one divided by the number of destinations.

In accordance with embodiments, it is the case that the dwell portion of the traffic participants in the route section is determined as a function of the traffic participant fraction, in that the dwell portion is determined as a function of traffic participant fraction and of the section length of the route section.

In accordance with embodiments, it is the case that the dwell portion of the traffic participant in the route section is determined as a product of the traffic participant fraction and of the section length divided by the length of the allocated optimal route.

In accordance with embodiments, the dwell portion of the traffic participant in the route section is determined as a function of the traffic participant fraction, in that the dwell portion is set equal to the traffic participant fraction. This corresponds to a situation in which all section lengths are considered to be of equal length.

In accordance with embodiments, it is the case that respectively when determining an optimal route, an already available traffic volume on the route sections is taken into consideration, in particular in that in each route section this traffic volume is compared with a section capacity of the route section.

To this end, it is possible that during the iteration procedure over the starting places, the traffic participants and fractions of the traffic participants, and also over the destinations and the route sections—in each case during the iteration procedure—the dwell portions in the route sections are continuously summated. If, in one of the route sections, the sum total of the dwell portions is too large in relation to the section capacity, this is taken into consideration during further iterations when determining the respective optimal routes.

In accordance with embodiments, it is the case that the following steps for calibrating the simulation are performed:
measure at least one real traffic flow, wherein each real traffic flow is allocated to a real measurement route section and is measured therein;
calculate a calibration factor with reference to the at least one real traffic flow and the traffic volume or rather volumes of traffic on the route sections that is/are determined in the simulation and that correspond to the real measurement route sections;
calculate a calibrated traffic volume on the other route sections according to the calibration factor.

This approach renders it possible to use a smaller number of traffic participants in the traffic flow simulation than are actually present in reality. As a result, the cost outlay is reduced when simulating large cities with a high number of traffic participants. It is possible to perform the calibration in the simplest case by means of multiplying the volumes of traffic on the route sections (which are in fact in each case a sum of dwell portions of traffic participants) by the calibration factor.

In accordance with embodiments, it is the case that:
a start time can be predetermined during the iteration for each starting place and for each of the N_Si traffic participants of the respective starting place;
from which in each case a time information is specified which is allocated to each of the dwell portions of the traffic participants in the route sections; and
the summation of the dwell portions of all traffic participants in one route section is performed while taking into consideration the respective time information.

The time information can be, by way of example, a point in time or a time interval at which, or in which, respectively, the dwell portion of the traffic participant in the route section lies. The summation of the dwell portions while taking into consideration the respective time information can by way of example summate the dwell portions individually in each case for different time intervals. Consequently, it is possible to determine a distribution of the dwell portions over time.

In embodiments, the time information for all dwell portions of a traffic participant is the same. This means that in a simulation of a temporal progression all the dwell portions of a traffic participant appear simultaneously in the network, in other words at the same point in time of a simulation time period.

This is in contrast to conventional for example agent-based methods, in which the route of a traffic participant is imaged in the network over time, thus the location of the traffic participant changes with the (simulated) time or rather the simulation time period, in that said traffic participant moves through the network.

The respective time information can be taken into consideration by virtue of the fact that dwell portions of a traffic participant after a specific dwell time has elapsed no longer contribute to the summation of the dwell portion.

It can also occur as a result of the fact that as the dwell time increases—when considered from the start time—corresponding to a predetermined progression in the function of the dwell time, they contribute to the summation of the dwell portions. The function can be continuous or comprise jumps. By way of example, the contribution to the summation procedure can commence at zero, as the dwell time increases can increase up to the value of the dwell portion and then reduce back to zero. Or the amount can commence with the value of the dwell portion and reduce to zero as the dwell time increases. This also applies here: in all cases the temporal variation of a dwell portion can occur simultaneously for all dwell portions of a traffic participant.

In corresponding embodiments, a temporal progression of a variation of an amount of the dwell portion of a traffic participant is the same for the summation procedure of the dwell portion in the route sections.

While the contributions of the individual traffic participants occur during the progression of the simulation time period in each case at different points in time, a (simulated) progression of the entire traffic volume on the route sections is produced over time, typically during the course of a day. The quality and significance of these volumes of traffic or rather of their temporal progression is high, although the shared contributions of an individual traffic participant, in other words of their traffic participant fractions, contribute or do not contribute, respectively, simultaneously in all route sections.

Thus—in contrast to an agent-based system—in such embodiments a journey of a traffic participant through the network, wherein the traffic participant is located in different route sections at different times, is not simulated but rather during a specific period of time all the traffic participant fractions of the traffic participant are located in all affected route sections of the optimum routes to all destinations (and are summated), and outside this time period they are not present.

The simulated progression is based in each case upon a current topology of the traffic network. Specific parameters that are essentially independent of the topology can be determined by means of comparing simulations with measurements, by way of example traffic flow measurements, using optimization methods. Consequently, it is possible using the method illustrated here for traffic flow simulation to perform a predictive, in other words forward-looking, simulation of the traffic flows for a current topology that deviates from the topology in which the measurements have been performed. This is a considerable difference to using measurements or rather historical data for the course of one day, since this historical data is unable to take changes in the topology into consideration.

Based on the predictive simulation with reference to the current topology, it is possible during the course of a day to control traffic guiding means and/or individual traffic participants.

In embodiments, the method comprises the following steps for determining start times of the traffic participants:

measure temporal progressions of real traffic flows, wherein each real traffic flow is allocated to a real measurement route section and is measured therein;

perform an optimization method including the iteratively repeated procedure of determining the traffic volume on route sections, wherein the start times of the traffic participants are varied in order for the temporal progressions of the traffic volume on route sections that correspond to the real measurement route sections to be approximated in the best possible manner to the temporal progressions of the real traffic flows.

Consequently, it is possible for the temporal progression of the start times and consequently the variation of the simulated volumes of traffic in the traffic network to be approximated to reality. By way of example, the start times or rather their temporal distribution are determined once, in the above described manner with reference to measurements in a specific topology of the traffic network. They are then used for the traffic flow simulation even when the topology has changed—by way of example as a result of road works.

During the execution of the optimization method, the start times of the traffic participants are varied, wherein the sum total of the traffic participants remains the same. By way of example, a number of traffic participants are allocated to a subsequent start point in time or rather time window in order to cause the traffic volume to be shifted to a later point in time. The sum total is generally predetermined by means of the already mentioned urban statistics.

In embodiments, the optimization is performed in the same manner but the traffic participants are each allocated to different traffic types. To this end, at least two traffic types are defined. Each traffic type comprises an allocated set of start places and destinations. A traffic type corresponds by way of example to commuter traffic, traffic traveling to retail outlets, work-related traffic, school traffic, logistics traffic, traffic traveling home at the end of the working day, etc. Each traffic type can be differentiated between an outward journey and a return journey.

In embodiments, the method comprises the following steps for determining identified start time distributions and/or traffic volumes of the different traffic types:

perform an optimization method including the iteratively repeated procedure of determining the traffic volume on route sections in the model of the traffic network, wherein the start time distributions and/or the traffic volume of all traffic types (V1, V2, . . . ) are varied in order for the temporal progressions of the traffic volume on route sections (3) that correspond to the real measurement route sections to be approximated in an optimal manner to the measured temporal progressions;

determine the identified start time distributions and/or traffic volumes as those which lead to this optimal approximation.

The result of the optimization method—the temporal distribution of start times—consequently also includes a differentiation between the different traffic types.

Consequently, it is furthermore possible to determine for each route section how much the individual traffic types contribute to its traffic volume. With reference to selective measurements of the traffic flows, in other words the entire traffic volume on individual route sections, and the information regarding the geographical distribution from the starting places and destinations, in each case a number of traffic participants, it is possible to determine the contribution of a specific traffic type to the traffic volume on a specific route section and in particular also the temporal change of this contribution, by way of example during the course of the day.

In embodiments, a system for machine learning is used in lieu of the above described optimization procedure. The corresponding method comprises the following steps for determining identified start time allocations and/or traffic volume of the different types of traffic:

training a system for machine learning using multiple sets comprising combinations of start time distributions and/or traffic volume of the different traffic types, wherein each of these sets is allocated a set of temporal progressions of the traffic volume on route sections in the model of the traffic network, wherein these route sections in the model of the traffic network correspond to the real measurement route sections;

determine the identified start time distributions and/or traffic volumes by means of the trained system for machine learning from the measured temporal progressions.

The learning system thus learns a mapping between the temporal distribution of the individual traffic types and the total traffic volume at multiple measuring locations, and subsequently determines the temporal distribution of the individual traffic types on the basis of measurements of the total traffic volume.

The method either by means of the above described optimization or by means of the system for machine learning consequently serves as a measuring method for determining the temporal distribution of portions of the different traffic types, wherein the traffic types are characterized by different starting places and destinations.

This temporal distribution changes—for a specific scenario—comparatively slowly, in other words it remains constant over a plurality of days, weeks or months. It is possible with reference to this temporal distribution to perform a predictive simulation with a traffic network that represents a current state.

One scenario or traffic scenario relates to traffic during the course of a day and is defined by means of a specific:
starting place number of traffic participants,
their destinations,
the allocation of the traffic participants to each traffic type,
the start times of the traffic participants during the course of the day.

Scenarios correspond by way of example to a working day, a Saturday, a Sunday, a working day with a holiday in the neighboring canton, etc. Traffic scenarios can moreover also be differentiated according to other parameters such as time of year, weather etc. It is possible—but not necessary—when determining the temporal distribution of the portions of traffic types to ascertain such parameters that characterize a traffic scenario, and for the predictive simulation in a specific situation in each case to use the distributions from a matching scenario.

Consequently, at least two traffic types (V1, V2, . . . ) are defined in embodiments and each traffic type (V1, V2, . . . ) comprises a set of starting places ($M_{Start}(V)$) that is allocated to the traffic type and a set of destinations ($M_{Dest}(V)$) that is allocated to the traffic type. Each traffic participant is allocated to one traffic type, and to one starting place and multiple destinations. The method comprises the following further steps:

measure temporal progressions of real traffic flows, wherein each real traffic flow is allocated to a real measurement route section and is measured therein;

determine identified start time distributions and/or traffic volumes of the different traffic types with reference to the measured temporal progressions and a model of the traffic network with the same topology as the real traffic system;

form a modified model of the traffic network by means of adjusting the topology according to changes in the real traffic system;

determine the traffic volume on route sections in the modified model of the traffic network while using the identified start time distributions and/or traffic volumes of the different traffic types.

As already mentioned above, it is possible based on the predictive simulation with reference to the current topology during the course of a day to control traffic guiding means. In accordance with embodiments, traffic guiding means in particular traffic lights are controlled according to the volumes of traffic on the route sections. In so doing, it is possible by way of example to give precedence to traffic flows on route sections carrying a relatively large amount of traffic in comparison to route sections that are not. Alternatively or in addition thereto, navigation devices in vehicles are controlled according to the volumes of traffic on the route sections.

In embodiments, the method comprises the following steps:

determine at least one busy route as an associated set of route sections that follow one another in the direction of movement and whose traffic volume exceeds a specific amount;

and at least one of the steps:
during a predetermined green interval time period, switch all the traffic lights in the busy route to green;
engage in the control procedure of vehicles on busy routes.

An engagement in the control procedure can be performed in different steps, for example as a speed recommendation to the driver or as a direct influence on the vehicle speed.

In so doing, route sections are considered separately in accordance with the direction of movement. This means that the procedure of determining which route sections are associated with a busy route and/or the procedure of switching the traffic lights are performed separately for each of the two directions of movement. This can occur in that route sections along the same link but in opposite directions are modeled as separate route sections and their traffic volume is modeled separately.

The procedure of determining busy routes can be repeated at different simulation time periods in the traffic network. As a result, different busy route sections occur depending upon the simulated time of day. Accordingly, it is possible to vary the procedure of switching the traffic lights during the course of a day.

In embodiments, a busy route comprises a sequence of route sections that follow one another in the direction of movement. Two or more busy route sections can issue into a busy route section at an entry side of said busy route section. Said busy route sections can divide into two or more sections on the output side of a busy route section.

It is possible to control the traffic guiding means in a purposeful manner on the basis of the above described determination of the allocation of the traffic participants to the different traffic types: this allocation varies over time, typically during the course of a day. Clearly and simply, it is possible by way of example that the morning commuter traffic predominantly traverses a specific junction from north to south, and later traffic traveling to retail outlets traverses said junction from east to west. Thus, busy route sections change during the course of a day. It is possible during the above described procedure of controlling the traffic guiding means to take changes of this type into consideration.

In embodiments, it is consequently possible when determining the at least one busy route to only take into consideration the traffic volume produced by a subset of the different traffic types. This subset does not cover the total set of traffic types. It is possible in particular to take into consideration only the traffic volume produced by one of the traffic types (for example only commuter traffic, only traffic traveling to retail outlets). Consequently, it is possible by means of the control procedure to give precedence to specific types of traffic.

When the above described procedure of determining the start times is performed according to the allocation of the traffic participants to the different traffic types, the traffic volume automatically varies according to the different traffic types during the course of a day.

As already mentioned above, it is possible to control individual traffic participants in combination with the predictive simulation with reference to the current topology during the course of a day. In embodiments, the method comprises to this end the following steps:

receiving a starting place and a destination of a real traffic participant;

determine an optimal route for this real traffic participant while taking into consideration any future volumes of traffic on the route sections of the traffic network;

issuing navigation instructions relating to this optimal route to this real traffic participant.

Consequently, it is not only possible to provide a navigation aid for a current state of the traffic network but rather with reference to a future state that is determined using the traffic flow simulation.

The data processing system for traffic flow simulation comprises storage means having stored therein computer program code means that describe a computer program, and data processing means for executing the computer program, wherein the execution of the computer program for performing the method produces the traffic flow simulation.

The computer program for the traffic flow simulation can be loaded into an internal storage device of a digital data processing unit and comprises a computer program code means, which, if it is executed in a digital data processing unit, causes said digital data processing unit to execute the method for the traffic flow simulation. In a preferred embodiment of the invention, a computer program product comprises a data carrier or rather a computer-readable medium, on which the computer program code means are stored.

In addition, it is possible to provide on the data processing system for the traffic flow simulation a device for identifying start time distributions and/or traffic volume of different traffic types in a real traffic network, and/or a device for controlling traffic guiding means, in particular traffic lights, and/or a device for controlling navigation devices in vehicles.

Further preferred embodiments are disclosed in the dependent claims. Features of device claims can be combined with features of the method claims, and conversely.

The subject of the invention is further described below with reference to preferred exemplary embodiments that are illustrated in the attached drawings. In each drawing schematically:

FIGS. 5-6 illustrate a traffic network in different states;

FIG. 7 illustrates a temporal distribution of start times and a traffic volume resulting therefrom;

FIG. 8 illustrates volumes of traffic of different traffic types;

FIG. 9 illustrates a traffic network with a superimposed grid for ascertaining urban statistics;

Figure 10:
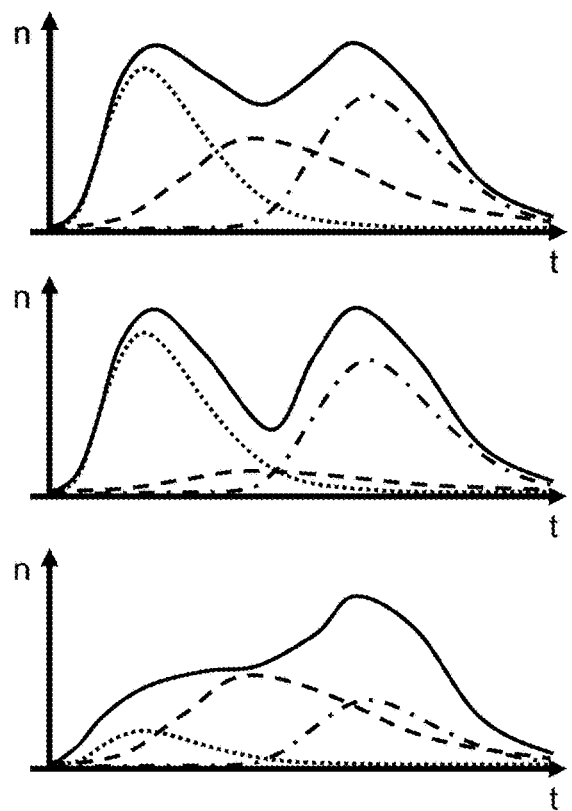
Figure 11:
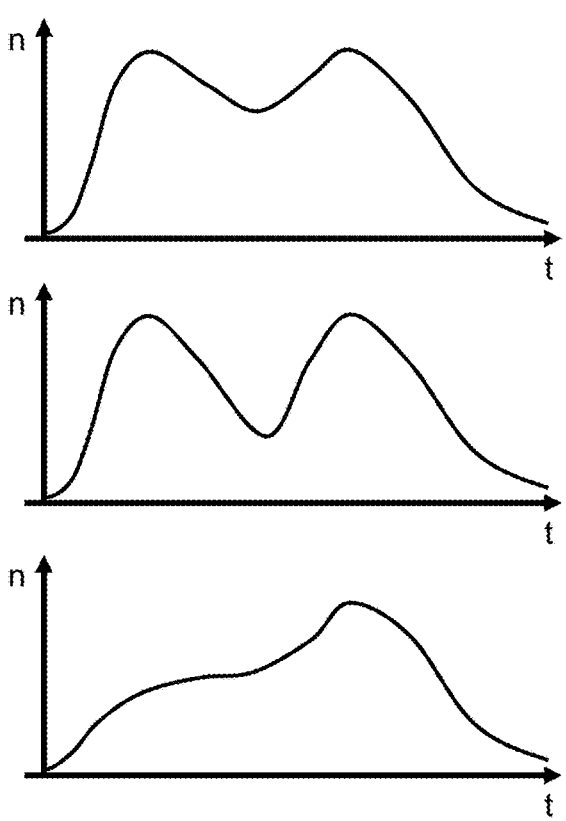
Figure 12:
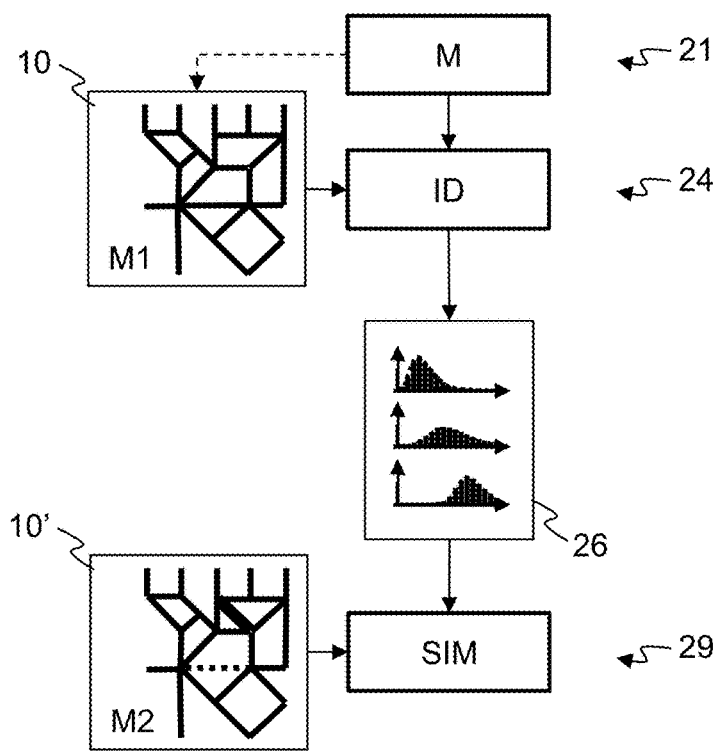
Figure 13:
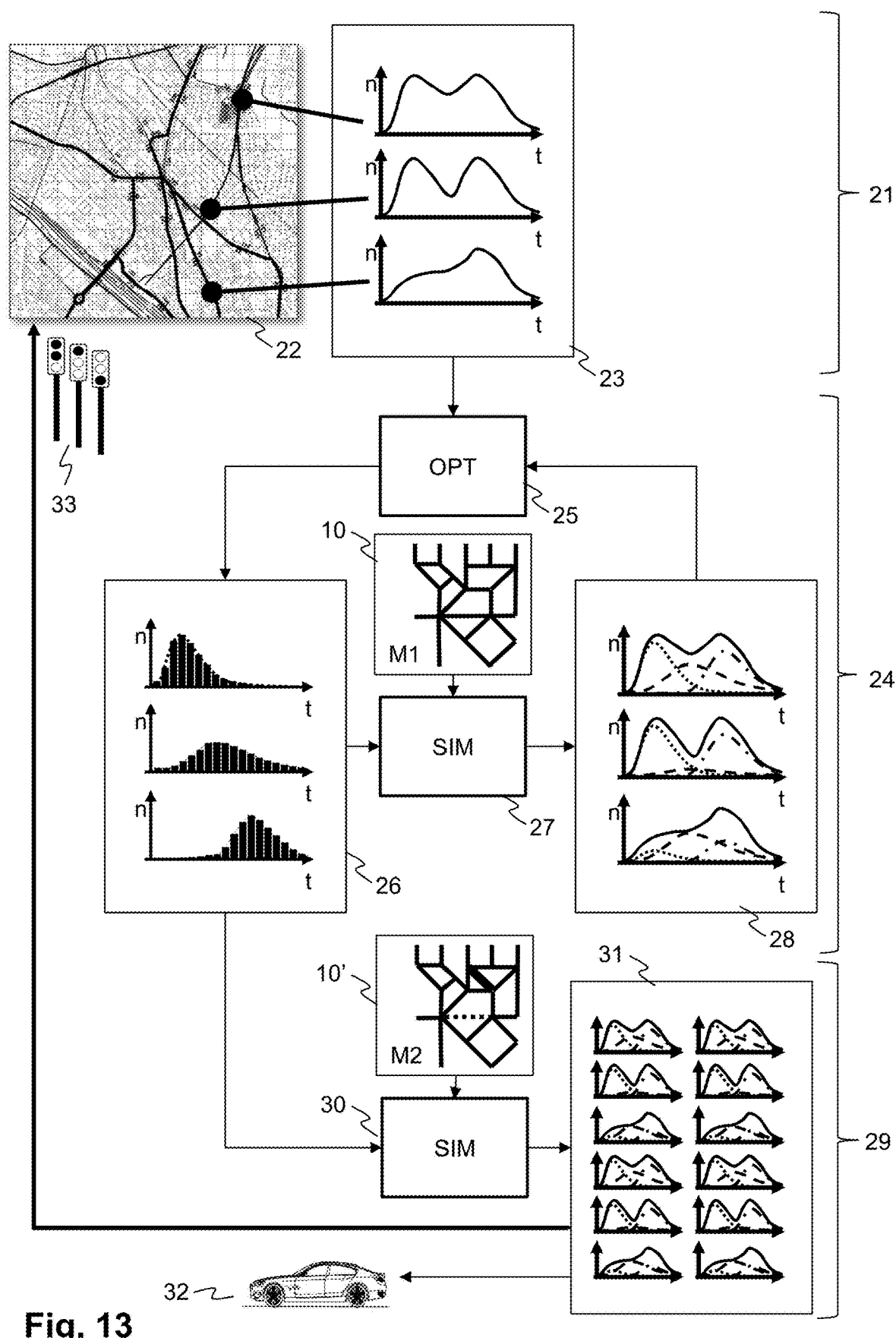

FIG. 10 illustrates an superposition of different traffic types at different counting locations in the traffic network, FIG. 11 illustrates corresponding graphs that indicate the traffic flow during the course of a day; and FIGS. 12-13 illustrate progressions for comparing a model with measured graphs that indicate traffic flow during the course of a day and for performing predictive simulations using the compared model.

Figure 1:
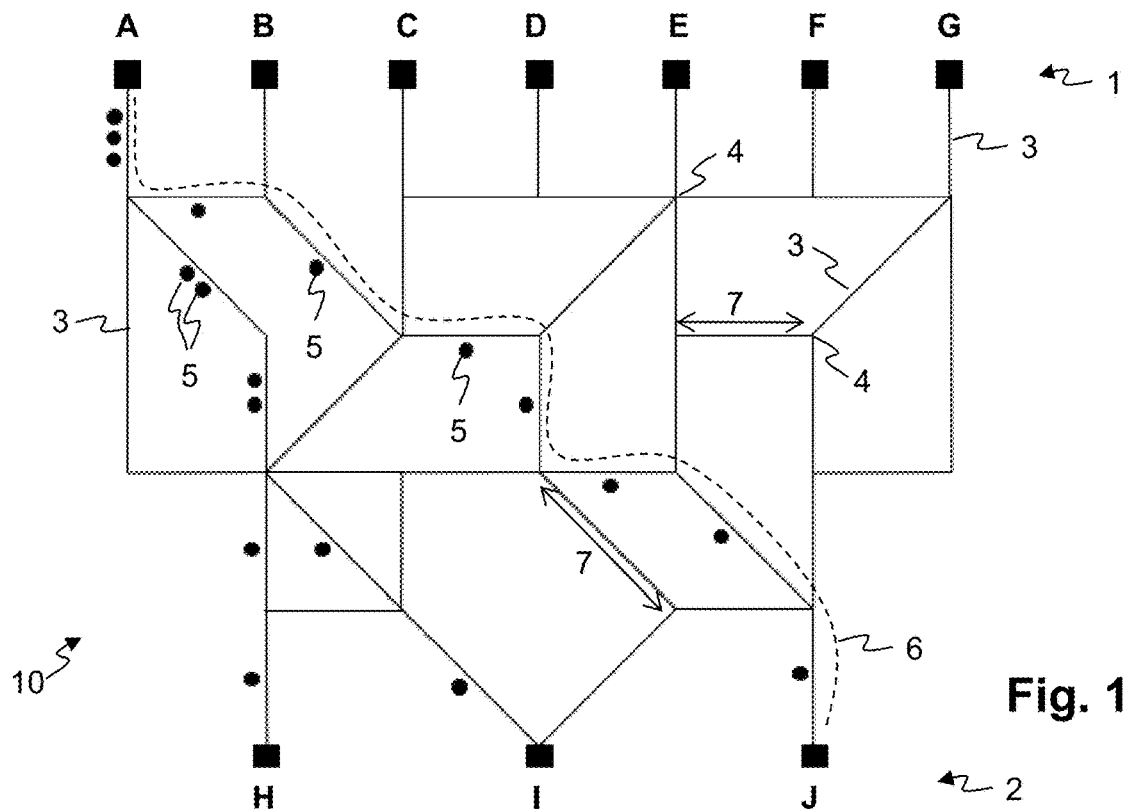
FIGS. 1-4 illustrate a traffic network and elements mapped thereon for explaining the method.

In the traffic flow simulator and in the method for traffic flow simulation, respectively, the individual traffic participants are divided into traffic participant fractions and distributed or dispersed over the traffic network from their starting place to their destinations. FIG. 1 illustrates the division and dispersion of a traffic participant from their starting place to all their possible destinations. The other images illustrate successively the further divisions and dispersions of further traffic participants.

FIG. 1 illustrates a traffic network 10 comprising nodes 4 and links, wherein nodes represent junctions and the links represent route sections 3.

FIG. 1 illustrates as an example commuter traffic, in other words, the traffic from residential areas to places of work. Residential areas (starting place A, B, C, D, E, F, G) are referred to in the further explanation as a whole as starting places 1. Accordingly, the places of work (destinations H, J, I) are referred to in the further explanation as a whole as destinations 2. The figure illustrates the starting places and destinations at the boundaries of the traffic network in order to simplify the explanation, in reality they can be distributed over the entire traffic network.

The traffic participants of a first starting place A are divided according to the number of all the destinations 2 and dispersed over the optimal routes 6, by way of example the shortest routes from the first starting place A to the individual destinations 2. The total number or starting place number of the traffic participants $N\_S_i$ for each i-th of the starting places 1 can be predetermined from an urban statistic. Depending upon each destination of the simulation, the total number can be set equal to a real number of traffic participants or it can be set proportional to the real number, using the same proportionality factor for all starting places 1. The starting place number can also be 1 for each of the starting places 1 if all starting places 1 are allocated the same number of traffic participants.

In the illustrated example, FIG. 1 illustrates an individual traffic participant divided by the number of destinations 2. In this example divided by three according to the number of destinations 2. From the first starting place A, each link to the first destination H of the traffic network is marked using a fraction of the traffic participants (traffic participant fraction), in this case therefore using a third of the traffic participants. The same method is performed for the optimal route 6, in this case the shortest route from the first starting place A to the second destination I. The method is performed for completeness likewise for the shortest route from the first starting place A to the third destination J.

In the example in FIG. 1, there are three optimal, in this case shortest, routes 6 from the first starting place A to the three destinations 3. A traffic participant of the first starting place A is divided by the number of possible destinations 3 and dispersed over the three optimal routes 6 to the destinations 3. The dispersion is illustrated in the figures by round markings, according to a dwell portion 5. Said dwell portion can be equal to a traffic participant fraction in the case of respective route sections 3 of equal length. Links or rather route sections 3 can lie on multiple routes and therefore can be marked more than once. The first link from the starting place A lies on all three shortest routes to the three destinations and said link has been marked three times. Links where the routes do not overlap are only marked once. Links where two routes overlap are marked twice. The routes from the starting places to the destinations can overlap. Links that lie on overlapped routes are marked more than once. In accordance with the direction of movement of the traffic participants, the dwell portions 5 are illustrated respectively in the direction of movement on the right-hand side of the links. Route sections 3 along the same link but in opposite directions can be considered as separate route sections 3 and their traffic volume are modeled separately. In other embodiments, the volumes of traffic on route sections 3 on the same link are taken into consideration and summated regardless of the direction of movement.

Figure 2:
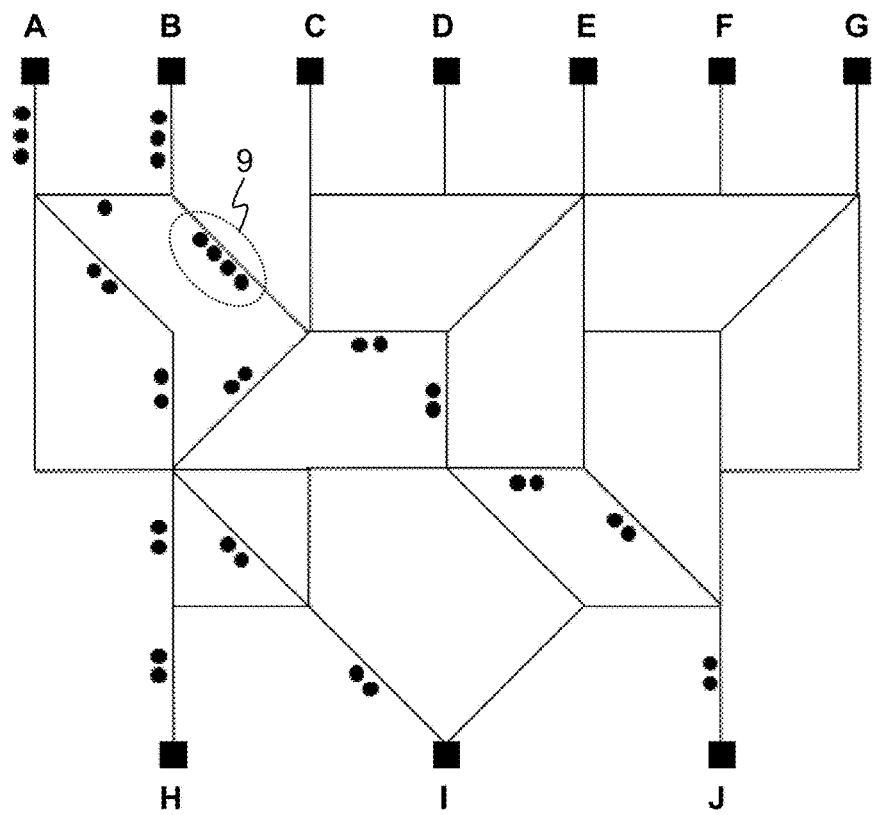

In FIG. 2, the method of dispersion onto the second starting place is continued. The traffic participants of the starting place B are again divided up according to the number of destinations and dispersed over the shortest routes from the starting place B to all the destinations. The dispersion from the starting place A to all the destinations and the dispersion from the starting place B to all the destinations overlap on links that lie on the common routes.

Figure 3:
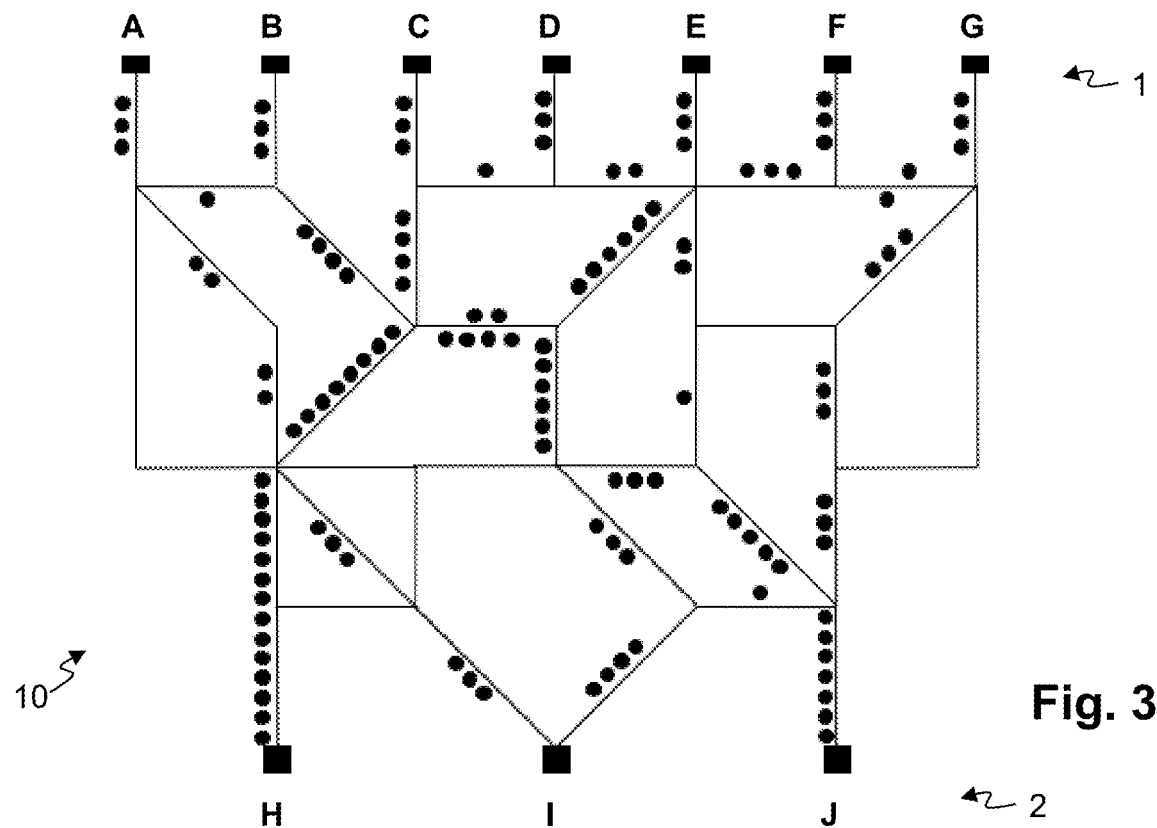

In FIG. 3, the method of dispersion on to all other starting places is continued. Each individual traffic participant of the starting places is divided according to the number of destinations and dispersed over the shortest routes from the starting places to the destinations. The dispersions from all the starting places to all the destinations and consequently the dwell portions 5 overlap on the links that lie on common routes.

If the method of dispersion from each starting place to each destination is concluded, the markings or rather the dwell portions 5 on the links are summated. These totals are a measurement for the traffic density and also for the traffic flows derived therefrom for the individual route sections 3 in the traffic network 10. It is possible to calculate from the traffic density a speed of the traffic participants in the route sections 3. Known methods are available for this. Said methods assume that traffic participants using a safe driving mode adapt their speed to the density while observing the local maximum speed. The traffic flow can likewise be determined from the traffic density and the speed.

The traffic flow (number of vehicles per unit of time) is generally regarded to be identical to the product of speed (distance covered per unit of time) and traffic density (number of vehicles per route section).

FIG. 3 illustrates by way of example the traffic status, in other words the volumes of traffic on the route sections, after the traffic participants or rather their dwell portions 5 have been dispersed for all the starting places and destinations.

Figure 4:
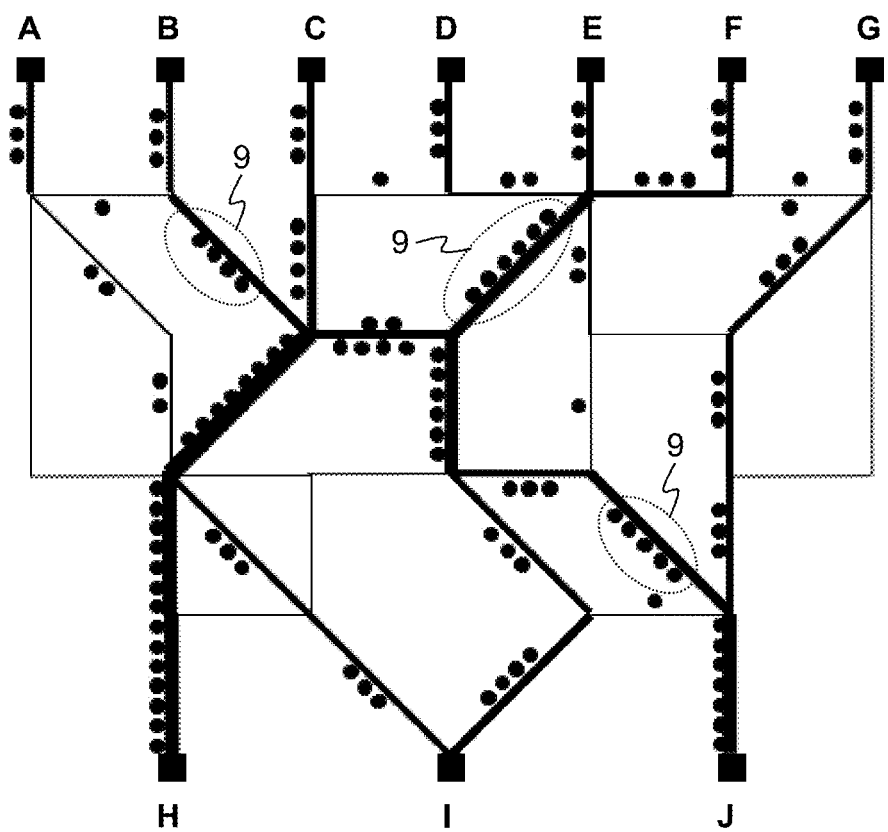

In FIG. 4, the markings of the dispersions are replaced by bold lines that illustrate the traffic densities or traffic flows from the generated traffic. FIG. 5 illustrates only the bold lines that result from the traffic densities or traffic flows of the generated traffic. In these examples, the bold lines are simplified and not illustrated in accordance with the direction of movement. In other embodiments, two lines are illustrated in the case of each link, each with a thickness or other graphical marking according to the section density 9 in each of the two directions of travel or rather route sections 3 along the link.

The exemplary description provided above applies for traffic networks comprising the same route sections or route sections of equal length.

For traffic networks comprising different route sections, or rather different link lengths, it is possible to provide the markings proportional to the route sections, or rather the link lengths. This means that the dispersion on to an individual route section is proportional to the route length from a starting place to the destination; the longer a route section, the more portions of a traffic participant are allocated thereto relative to the other route sections.

If the traffic system includes destinations that comprise a different level of attractiveness, for example in the case of traffic traveling to retail outlets, then the distribution or dispersion of individual traffic participants is weighted with respect to the number of possible destinations, in particular weighted relatively according to the attractiveness of the destinations. This weighting can be referred to as the destination weighting factor. Multiple destination weighting factors can be allocated in each case to the destinations as realistic in particular whole number values. They can also be scaled or standardized, by way of example by dividing by the sum total of all destination weighting factors of the network under consideration.

If the section densities 9 change during the course of the method, this can be taken into consideration when determining the optimal routes. It is also possible to take into consideration if the section density 9 is too large in one route section 3 with regard to a section capacity 8 of this route section 3. Consequently, other optimal routes 6 from a starting place to the destinations can arise according to the state of the traffic network. The further dispersion on to the new optimal routes 6 is then performed. In order to make the simulation independent from the sequence in which the starting places 1 are processed, the iterative dispersion of the traffic participants of the starting places 1 can be performed a number of times in the order of the starting places 1, wherein during each run-through only a part of the traffic participants of each location is dispersed.

Illustration of Temporal Traffic Fluctuations

It is also possible to illustrate the temporal fluctuations in the volumes of traffic. The dispersion is increased or reduced in proportion to the traffic volume according to the build-up of traffic and the subsequent reduction in the traffic volume. This means that the traffic participants from one starting place are not all used simultaneously for the dispersion procedure. According to a temporal distribution of the traffic volume (FIG. 7), the number of traffic participants of one starting place is divided over time. In proportion to the distribution of the traffic volume, the individual parts of the traffic participants of one starting place are likewise divided over time and used for the dispersion procedure. In each case, time periods of a specific length are considered, by way of example one minute, five, ten, fifteen, thirty or sixty minutes etc. In each time period of the simulation procedure, in the case of the starting places a number of allocated traffic participants according to the height differences of the respective bars in FIG. 7 are dispersed divided into the traffic participant fractions: at a point in time t1 or rather in a time period lying around said point in time, a number $n_{t1}$ of traffic participants is dispersed divided into traffic participant fractions. At a point in time t2, additional $n_{t2}$ traffic participants are dispersed, as a result of which the entire traffic volume is increased by $n_{t2}$, illustrated by the height of the bar at t2.

At further points in time t3, t4, etc. the traffic volume increases further. As a result, during the course of performing the method, the section densities 9 change after each time period, which can be taken into consideration as already mentioned above when determining the optimal routes. After a certain dwell time, traffic participants or rather their traffic participant fractions are removed from the traffic network and the traffic volume reduces. This dwell time can be equal for all the traffic participant fractions depending upon the level of detail of the model or said dwell time can be different for different traffic participant fractions, by way of example according to the length of the route over which a traffic participant fraction is divided.

In each case, the traffic volume is obtained as an integral of the changes caused by traffic participant fractions that are added or rather removed. In the following steps, it is mathematically of equal value whether the traffic volume or its changes are determined.

In the case of this temporal distribution and dispersion, it is therefore possible for each traffic participant or rather their dwell portions to be present in the route sections over a specific duration of a simulation time period. During this period of simulation, they contribute to the summation of the dwell portions, thereafter they do not. They can also contribute during this period only to a temporal varying weighting.

With regard to the illustration in accordance with FIG. 3, this means that the individual dwell portions 5 appear during the course of the simulation period and subsequently disappear.

In this case, the temporal distribution of the traffic participants over the respective optimal routes 6 and the route sections 3 can also be determined based on the mentioned temporal distribution of start times. The speed and the traffic flow in one route section 3 can likewise be determined therefrom dependent upon the section density 9 in the route section 3 or rather by means of known methods. As already mentioned above, the optimal routes 6 can change with regard to the section capacities 8 as the section densities 9 increase.

To summarize, it is therefore possible to determine the traffic volume as a temporal dispersion of the traffic participants, as illustrated in FIG. 7, from a start time distribution that indicates in a particular time period how many traffic participants are introduced into the traffic network. A start time distribution can also optionally define a dwell time for each traffic participant or respectively at specific time sections how many traffic participants are removed from the traffic network. The dwell time for each traffic participant can by way of example be the same for all the traffic participants or it can be the same for all traffic participants of a specific traffic type or it can be determined for individual traffic participant fractions in accordance with a length of the optimal route to their destination.

The mentioned temporal dispersion of the traffic participants can be adjusted to suit a measured temporal distribution of the traffic volume. By way of example, the procedure is based on the distribution of start times in the starting places, which leads to a Gaussian distribution or a triangular distribution of the traffic volume. It is possible in the case of all the starting places to select the same or different temporal distributions. In one optimizing method, parameters of these distributions (by way of example width and height of the distribution) can be varied in order to adjust the temporal distribution of the traffic volume in the route sections in the best possible manner to the measurements taken in reality. If the measurements illustrate a traffic flow (in other words vehicles per unit of time), it is possible for compensating purposes to calculate the (simulated) traffic flow from the traffic volume, as already described elsewhere.

The temporal dispersion of the traffic participants can represent different traffic types or rather be allocated to different traffic types. FIG. 8 illustrates the different traffic types according to the traffic volume distributed along a time axis t for the duration of one day. By way of example, the uppermost graph illustrates the traffic volume for the morning commuter traffic, the middle graph indicates work-related traffic and the lower graph indicates the evening commuter traffic. The total number of traffic participants of one traffic type is equal to the sum total of the traffic participants that are distributed over the individual time periods of the entire time duration.

The total number of traffic participants for each traffic type and the starting places 1 and destinations 2 in the traffic network 10 can be generated by way of example from urban statistics in the following manner, as already explained with regard to FIG. 1. FIG. 9 illustrates a traffic network 10 with a superimposed grid. A corresponding number of persons or utilization capacity is known from urban statistics in relation to each field in the grid, by way of example residential population, work places, retail outlets, free-time options, etc. Depending upon the traffic type, this produces different starting places and destinations and also numbers allocated thereto. By way of example, the starting places and a respective total number of traffic participants for each starting place are determined for the morning commuter traffic based on the residential population in the different grid fields, and the destinations and a proportional distribution of the traffic participants is determined by means of the number of work places in the different grid fields. In a similar manner, the number of participants in other traffic types and also their starting places and destinations according to the distribution into the grid fields is determined as followed:

morning commuter traffic: residential areas—work places
evening commuter traffic: work places—residential areas
traffic traveling to retail outlets: residential areas—retail outlets
traffic returning from retail outlets: retail outlets—residential areas
work-related traffic: between work locations
etc.: further allocations in accordance with urban statistics By way of example, in the case of commuter traffic, the absolute number of traffic participants is predetermined by the number of employed people living in the residential areas, and this number is dispersed into the different grid fields according to the number of work places.

The simulation procedure by means of dispersing the traffic participants of the different traffic types over the traffic network 10 is performed as explained above. It is thereby possible in the simulation of the traffic network 10 to determine for each route section and each time period under consideration the portion of the different traffic types of the total traffic. FIG. 10 illustrates a superposition of different traffic types at three different locations in the traffic network. The three broken lines in the graph correspond to morning commuter traffic, work-related traffic and evening commuter traffic. The continuous line in the graph corresponds to the total of said traffic. In the middle graph, the work-related traffic constitutes a smaller portion of the total traffic volume compared with the uppermost graph. In the lower graph, the morning commuter traffic constitutes a smaller portion.

FIG. 11 illustrates graphs that indicate the traffic flow during the course of a day at counting locations in the traffic network. Said graphs illustrate the traffic flow (number of n vehicles per unit of time, by way of example per minute), said traffic flow being ascertained at each of the counting locations over a specific time period, in this case over one day. In a real traffic network, depending upon it size, dozens up to hundreds of counting locations are provided. Generally, the vehicles are counted separately depending upon the direction of travel.

If a graph indicating traffic flow over the course of a day is obtained from a simulation procedure, then the contributions of the different traffic types are known, as illustrated in FIG. 10. If a graph indicating traffic flow over the course of a day is obtained from measurements, then only the sum total of all traffic types is known, as illustrated in FIG. 11. In these examples, the graphs indicating traffic flow over the course of a day that are obtained from measurements and a simulation procedure are identical, which corresponds to a perfect simulation. In reality, this is generally not the case.

For the quality of the modeling procedure and consequently also of the simulation procedure, it can be of advantage to be able in each case to allocate portions of the graph indicating traffic flow over the course of a day to different traffic types. Since in reality it is only possible to calculate the sum totals, the portions of the traffic types are determined in accordance with the method described below by means of adjusting the model to suit the reality with the result that this images the measured graphs indicating traffic flow over the course of a day.

In order to adjust the parameters of the simulation procedure to fit reality, referred to as "system identification" in technical terminology relating to control engineering, it is possible in accordance with embodiments to assume that the topology of the real traffic network is mapped correctly in the model. The total sum for each traffic type can be considered as constant, by way of example predetermined in accordance with urban statistics. The traffic volume of the different traffic types is considered as degrees of freedom according to identified parameters. This can be illustrated as a temporal distribution of the traffic volume itself or expressed in the form of the change of the traffic volume by means of start times and dwell times of traffic participants indicating traffic flow over the course of a day. As described above, an optimization method can vary parameters of the temporal distribution and in fact separately for the different traffic types. Dependent upon the complexity of the traffic network 10 and the number of counting locations, it is possible to identify a more or less complex representation of the respective temporal distributions. By way of example, the following can be such a representation:

center and variance of a normal distribution;
parameters of another distribution; or
for each of the time periods, the number of allocated traffic participants indicating traffic flow over the course of a day.

In this case, the boundary condition that the sum total is predetermined over all time periods can apply in each case.

It is possible to use known optimization algorithms, by way of example stochastic optimization, genetic algorithms, etc.

FIG. 12 illustrates an overview of a procedure for comparing a model with measured graphs that indicate the traffic flow during the course of a day and for performing predictive simulations using the compared model: in one section of the procedure of ascertaining 21 the traffic flow using traffic counting devices and a corresponding processing device the ascertained graphs that indicate the traffic flow during the course of a day are ascertained in the real traffic system. In one section of the identification procedure 24 and a corresponding identification device, the traffic volume 26 of the different traffic types is determined therefrom or, equivalent thereto, corresponding start time distributions. The identification procedure 24 uses in this case a modeled traffic network 10, the topology of which represents the topology of the real traffic system. The topology of the real traffic system is tracked in the modeled traffic network 10 by means of a dashed arrow.

It is now assumed that the traffic volume that is determined in this manner, in other words the temporal distribution 26, is the same for a traffic scenario of a similar relationship. Consequently, it is possible at a later point in time, after changes have occurred in the real traffic system 22, for example as a result of road works, to track these changes in the model of the traffic network 10'. This model with the adjusted topology can be used together with the determined traffic volume 26 or rather with the start time distributions that form the basis for said determined traffic volume for a predictive simulation 29 and a corresponding processing device.

FIG. 13 illustrates the underlying procedure in accordance with a possible embodiment, with a greater degree of detail: in one section of the procedure of ascertaining 21 the traffic flow, graphs 23 that indicate the traffic flow during the course of a day are ascertained in the real traffic system 22 at different counting locations. The procedure of ascertaining said graphs is performed using corresponding traffic counting devices. In one section of the identification procedure 24, the start time distributions or rather the traffic volume 26 of different traffic types are varied using an optimization method 25 in order to compare a simulation 27 with reference to the modeled traffic network 10, which generates simulated graphs 28 that indicate the flow of traffic during the course of a day, with the ascertained graphs 23 that indicate the flow of traffic during the course of a day. The simulation for identification purposes is performed using a corresponding simulation device 27. The optimization procedure can be performed using a corresponding optimization device, wherein said device can be identical to the simulation device 27.

The optimization method 25 assumes that during the comparison the topology of the modeled traffic network 10 and the real traffic system 22 are identical. After the optimization method 25 has been concluded, the start time distributions and/or traffic volume 26 of the different traffic types are available as a result. As already described, it is possible to perform a simulation 30 using the start time distributions that have been determined in this manner or rather the traffic volume 26 with a different, in particular future, topology of the model traffic network 10'. This corresponds to the section of the predictive simulation 29 illustrated in FIGS. 12 and 13. The predictive simulation is performed using a corresponding simulation device 30. This can be identical to the simulation device 27 which is used for the identification procedure.

In this predictive simulation, the portions of the different traffic types that are expressed by means of predictive graphs 31 that indicate the flow of traffic during the course of a day are known. Consequently, it is possible to realise an adjusted control of the real traffic system 22 by means of traffic guiding devices, by way of example traffic lights 33, or by means of navigation devices of traffic participants in vehicles 32.

In embodiments, methods for machine learning are used in lieu of the optimization algorithms. To this end, in a first step so as to generate training data:

a topology of the traffic network 10 is predetermined;

multiple start time distributions and/or traffic volume of different traffic types are predetermined, in other words several for morning commuter traffic ($V_{PM1}$, $V_{PM2}$, ... ), several for work-related traffic ($V_{A1}$, $V_{A2}$, ... ), several for evening commuter traffic ($V_{P41}$, $V_{P42}$, ... ) etc.;

different sets comprising combinations of the start time distributions and/or traffic volume of the different traffic types ($\{V_{PM1}, V_{A1}, V_{P41}\}$, $\{V_{PM1}, V_{A2}, V_{P41}\}$, $\{V_{PM1}, V_{A1}, V_{P42}\}$; ... ), are determined and for each set and for the predetermined topology respectively graphs that indicate the flow of traffic during the course of a day are determined using the traffic flow simulation at multiple counting locations, which correspond in each case to counting locations in the real traffic network.

In a second step, a learning system is trained using the sets of start time distributions and/or traffic volume and the allocated graphs that indicate the flow of traffic during the course of a day. Input data is in this case the graphs that indicate the flow of traffic during the course of a day, output data is the sets of start time distributions and/or traffic volume of the different traffic types and the allocations of the output data to the input data has to be learned by the system.

In a third step, the allocation that has been learned is used; to this end, the system that is learning with the measured graphs that indicate the flow of traffic during the course of a day, which have been determined in the real system (the topology of which has been used in the first step during the learning process) is stored as input data. The system that is learning determines therefrom the appropriate sets of start time distributions and/or of the traffic volume of the different traffic types.

Consequently, as in the case of the above described optimization method, this produces as a result the start time distributions and/or the traffic volume 26 of the different traffic types, and can be used in the predictive simulation 29.

Application of the Traffic Flow Simulation

A typical road network of a city comprises numerous road works that constantly change the traffic flow. On average, there are for example in European cities one road works for every 300 to 500 inhabitants. This can result in 200 to 350 road works for a city with 100,000 inhabitants. The total number of road works remains more or less constant but their locations constantly change.

The road works in a city change the traffic network on a weekly basis, often even daily. These changes in the traffic network have a great influence on the traffic flows. The traffic participants try to find their optimal route through the road network on a weekly basis or almost on a daily basis. In addition, the number of inhabitants and work places in a city increase, which likewise constantly changes the traffic network and the traffic volume.

During the course of conventional traffic simulations, in which statistics of the traffic counts are used, it is always only possible to analyze an historical traffic behavior. The results lag behind the real situation. Prior to the analyses being performed, the traffic behavior has already changed owing to the changed road network.

It is possible using the method described here for traffic simulation or traffic analysis to map for real the traffic for a specific state of the traffic network. In addition, the traffic is not generated from a traffic statistic but rather from the urban statistic (inhabitants, work places, useable areas etc.). If a road network changes, then it is possible in the planning phase to predictively analyze the traffic behavior (traffic density, traffic flow, speeds etc.) of an entire city. These predictive analyses form the foundations for guiding the road traffic in an optimal manner at the point in time when the corresponding road works are started.

By way of explanation, FIGS. 5 and 6 illustrate a road network (FIG. 5) and the same road network with changes (FIG. 6). If a road network is changed, the dispersion of traffic participants is different across the changed traffic network. The traffic densities and also traffic flows or travel speeds can be determined very quickly and efficiently.

Conventional traffic simulations have a problem with regard to determining the division of traffic at road junctions or forks in the road: a decision has to be made as to which route an individual participant selects. This leads to inaccuracies in the traffic densities and traffic flows. This problem is quite simply solved by means of the method described here for traffic simulation or traffic analysis by means of the dispersion procedure: the traffic participant is allocated—proportionately—to multiple routes. Surprisingly, this results in an informative model of the entire behavior of all the traffic participants.

Application for Traffic Control

One possible application is the coordination of switching times of traffic lights. In most cities, the switching times of the traffic lights are set for longer periods of time to a fixed time period. However, traffic networks in the cities change on a weekly or daily basis as a result of road works. In order for the traffic to flow, the switching times of the traffic lights can be adjusted according to the anticipated traffic flow.

By way of example, traffic lights at a junction can be set such that traffic participants are given precedence on a route section 3 for which the method has determined a high section density 9—relative to other route sections 3 that issue into the junction.

In embodiments, busy routes are determined and given precedence when switching the traffic lights. Busy routes comprise route sections that have a relatively high traffic volume ("busy route sections"). A busy route comprises in each case a sequence of such route sections. They form a directed graph without loops. In this case, the route can branch in that a busy route section divides into two connecting busy route sections or two busy route sections that combine to form one route section. It is possible for one traffic network to comprise multiple disjointed busy routes. In a simple case, a busy route comprises only one sequence of sequential busy route sections without branches. FIG. 6 illustrates by way of example two busy routes 11 bordered by the dashed lines: on the left hand side of the figure one without branches, on the right hand side of the figure one with branches.

It is possible by way of example to determine the busy routes on the basis of a first route section that has a maximum traffic volume. It is then possible on this basis—in the direction of movement—forward and rearward to search for adjoining route sections (in each case one or more) that have a high traffic volume which feed traffic onto the first route section or receive traffic therefrom. This step can be repeated iteratively in the forward and rearward direction until the volumes of traffic on the route sections under consideration fall below a specific measurement.

A busy route can be given precedence by means of switching the traffic lights in that repeatedly during a specific time period—by way of example one, two, three or more minutes—all the traffic lights in the direction of movement being considered along the busy route are switched to green.

In the case of larger traffic networks and greater spacings between traffic lights it is generally also possible to select longer time periods.

Since the traffic networks or rather their topology change on a weekly or daily basis, for example as a result of road works, the traffic flow at a junction also changes accordingly. During peak travel times, the traffic flow can change at a junction within minutes. In order for the traffic to be able to flow, it is necessary for all the traffic lights in one traffic network to change the light switching times within a few minutes according to the traffic flow. In addition, it is necessary for all the traffic lights in one traffic network to be coordinated precisely with one another by means of these dynamics. It is possible using the method presented here for traffic flow simulation to improve the quality of such an adjustment and coordination of said traffic lights in comparison to conventional systems since the former method performs predictive simulation that is adjusted to suit the current network topology is performed and the traffic volume determined. The latter method on the other hand only has available:

historical measurement data regarding an entire day but said data relates to a network topology that is no longer current, or real time data required the traffic flow but which does not include a statements regarding the future.

It is possible using the method described here for traffic flow simulation and traffic analysis to analyze the traffic network together with current and future traffic changes in a predictive manner over freely selectable time intervals in advance. Consequently, the switching times of the traffic lights can be determined and coordinated with one another, or other traffic guiding systems can be controlled and coordinated with one another. As a consequence, it is possible in a proactive manner and in advance to react to the anticipated traffic behavior in different and changing states of the traffic network and its traffic volume and the traffic can be guided in a maximum optimal manner so as to aid the flow.

The invention claimed is:

1. A device for traffic flow simulation for determining a traffic volume on route sections (3) in a traffic network (10), comprising a digital data processing unit that comprises a simulation device, said device being configured on the basis of:

a traffic network (10) as a graph of route sections (3) and nodes (4), wherein a first set of nodes (4) are starting places (1) and each starting place (1) is allocated a starting place number of traffic participants, and a second set of nodes (4) are destinations (2), wherein it is not predetermined which destination a specific traffic participant is traveling to from his starting place, and wherein, to determine the traffic volume on the route sections (3) a dispersion of traffic participants is used, in which each single traffic participant from one starting place is divided by the number of possible destinations and a corresponding traffic participant fraction is dispersed over the optimal routes to all possible destinations, by performing the following steps:

for each starting place (1) and for each of the single traffic participants of the starting place (1):

determine allocated to each of the destinations (2) respectively a traffic participant fraction of each single traffic participant, corresponding to a distribution of the single traffic participants over the destinations;

determine allocated to each of the destinations (2) respectively an optimal route (6) from the starting place (1) to the destination (2);

determine for each of the destinations (2) and for each route section (3) of the optimal route (6) a dwell portion (5) of the single traffic participant in the route section (3) as a function of the traffic participant fraction that is allocated to this destination (2);

for each of the route sections (3) of the traffic network (10):

determine the traffic volume on the route section (3) by means of summating the dwell portions (5) of all traffic participants in this route section (3).

2. The device as claimed in claim 1, wherein at least two traffic types (V1, V2, . . . ) are defined, each traffic type (V1, V2, . . . ) comprises an allocated set of starting places ($M_{start}(V)$) and an allocated set of destinations ($M_{Dest}(V)$) and each traffic participant is allocated to a traffic type wherein the device further comprises the following units:

traffic counting devices for measuring temporal progressions (23) of real traffic flows, wherein each real traffic flow is allocated to a real measurement route section in a real traffic system (22) and is measured therein;

an identification device for determining identified start time distributions and/or traffic volume (26) of the different traffic types ton the basis of the measured temporal progressions (23) and a model of the traffic network (10) comprising the same topology as the real traffic system (22);

and the simulation device is configured so as to:

form a modified model of the traffic network (10') by means of adjusting the topology according to changes in the real traffic system (22);

determining the traffic volume on route sections in the modified model of the traffic network (10') by using the identified start time distributions and/or traffic volumes (26) of the different traffic types.

3. The device as claimed in claim 1, configured so as to control at least one of the following:

controllers of traffic guiding means, in particular traffic lights, according to the volumes of traffic on the route sections (3);

controllers of navigational devices in vehicles according to the volumes of traffic on the route sections (3) and comprising interfaces to such controllers.

4. A method for traffic flow simulation so as to determine a traffic volume on route sections (3) in a traffic network (10), said method being performed on a digital data processing unit on the basis of:

a traffic network (10) as a graph of route sections (3) and nodes (4), wherein a first set of nodes (4) are starting places (1) and each starting place (1) is allocated a starting place number of traffic participants, and a second set of nodes (4) are destinations (2), wherein it is not predetermined which destination a specific traffic participant is traveling to from his starting place, wherein the following steps are performed so as to determine the traffic volume on the route sections (3) by using a dispersion of traffic participants, in which each single traffic participant from one starting place is divided by the number of possible destinations and a corresponding traffic participant fraction is dispersed over the optimal routes to all possible destinations, by:

for each starting place (1) and for each of the traffic participants of the starting place (1):
determining allocated to each of the destinations (2) respectively a traffic participant fraction of each single traffic participant, corresponding to an allocation a distribution of the single traffic participants to the over the destinations;
determining allocated to each of the destinations (2) respectively an optimal route (6) from the starting place (1) to the destination (2);
determining for each of the destinations (2) and for each route section (3) of the optimal route (6) a dwell portion (5) of the single traffic participant in the route section (3) as a function of the traffic participant fraction that is allocated to this destination (2);
for each of the route sections (3) of the traffic network (10):
determining the traffic volume on the route section (3) by means of summating the dwell portions (5) of all traffic participants in this route section (3).

5. The method as claimed in claim 4, wherein the dwell portion (5) of the traffic participant in the route section (3) is determined as a function of the traffic participant fraction in that the dwell portion (5) is determined as a function of the traffic participant fraction and a section length (7) of the route section (3).

6. The method as claimed in claim 5, wherein the dwell portion (5) of the traffic participant in the route section (3) is determined as a product of the traffic participant fraction and the section length (7) divided by the length of the allocated optimum route (6).

7. The method as claimed in claim 4, wherein
a start time can be predetermined during the iteration for each starting place (1) and for each of the traffic participants of the starting place (1) respectively;
from which in each case a time information is specified which is allocated to each of the dwell portions (5) of the traffic participants in the route sections (3); and
the summation of the dwell portions (5) of all traffic participants in one route section (3) is performed by taking into consideration the respective time information.

8. The method as claimed in claim 7, wherein the time information for all the dwell portions (5) of a traffic participant is the same, and
in particular a temporal progression of a variation of a contribution of the dwell portions (5) of a traffic participant is the same for the summation of the dwell portions (5) in the route sections (3).

9. The method as claimed in claim 7, comprising the following steps so as to determine start times of the traffic participants:
measure temporal progressions of real traffic flows, wherein each real traffic flow is allocated to a real measurement route section and is measured therein;
perform an optimization method including the iteratively repeated procedure of determining the traffic volume on route sections (3), wherein the start times of the traffic participants are varied, in order for the temporal progressions of the traffic volume on route sections (3) that correspond to the real measurement route sections to be approximated in the best possible manner to the temporal progressions of the real traffic flows.

10. The method as claimed in claim 4, wherein at least two traffic types (V1, V2, . . . ) are defined, each traffic type (V1, V2, . . . ) comprises an allocated set of starting places ($M_{Start}(V)$) and an allocated set of destinations ($M_{ZDest}(V)$) and each traffic participant is allocated to one traffic type, said method comprises the following further steps:
measure temporal progressions (23) of real traffic flows, wherein each real traffic flow is allocated to a real measurement route section in a real traffic system (22) and is measured therein;
determining identified start time distributions and/or traffic volumes (26) of the different traffic types on the basis of the measured temporal progressions (23) and a model of the traffic network (10) with the same topology as the real traffic system (22);
form a modified model of the traffic network (10') by means of adjusting the topology according to changes in the real traffic system (22);
determining the traffic volume on route sections in the modified model of the traffic network (10') by using the identified start time distributions and/or traffic volumes (26) of the different traffic types.

11. The method as claimed in claim 10, comprising the following steps so as to determine identified start time distributions and/or traffic volume (26) of the different traffic types:
perform an optimization method (25) including the iteratively repeated procedure of determining the traffic volume on route sections (3) in the model of the traffic network (10), wherein the start time distributions and/or the traffic volumes (26) of all traffic types (V1, V2, . . . ) are varied, in order for the temporal progressions of the traffic volume on route sections (3) that correspond to the real measurement route sections to be approximated in an optimal manner to the measured temporal progressions (23);
determining the identified start time distributions and/or traffic volume (26) as those which lead to this optimal approximation.

12. The method as claimed in claim 11, comprising the steps:
input a starting place and a destination of a real traffic participant;
determining an optimal route for this real traffic participant while taking into consideration future volumes of traffic of the route sections (3) of the traffic network;
transmitting navigation instructions according to this optimal route to this real traffic participant.

13. The method as claimed in claim 10, comprising the following steps so as to determine identified start time distributions and/or traffic volume (26) of the different traffic types:
training a system for machine learning using multiple sets comprising combinations of start time distributions and/or traffic volumes (26) of the different traffic types, wherein each of these sets is allocated a set of temporal progressions of the traffic volume on route sections (3) in the model of the traffic network (10), wherein these route sections (3) correspond to the real measurement route sections;
determining the identified start time distributions and/or traffic volumes (26) by means of the trained system for machine learning from the measured temporal progressions (23).

14. The method as claimed in claim 10, comprising the steps:
  determining at least one busy route as an associated set of route sections (3) that follow one another in the direction of movement and whose traffic volume exceeds a specific amount;
and at least one of the steps:
  during a predetermined green interval time period, switch all the traffic lights in the busy route to green;
  engage in the control procedure of vehicles on busy routes;
wherein when determining the at least one busy route (11) only the traffic volume produced by means of a subset of the different traffic types is taken into consideration, in particular only the traffic volume produced by means of one of the traffic types.

15. The method as claimed in claim 4, comprising at least one of the steps:
  controlling traffic guiding means, in particular traffic lights, according to the volumes of traffic on the route sections (3);
  controlling navigational devices in vehicles according to the volumes of traffic on the route sections (3).

16. The method as claimed in claim 15, comprising the steps:
  determining at least one busy route as an associated set of route sections (3) that follow one another in the direction of movement and whose traffic volume exceeds a specific amount;
and at least one of the steps:
  during a predetermined green interval time period, switch all the traffic lights in the busy route to green;
  engage in the control procedure of vehicles on busy routes.

17. A data processing system for traffic flow simulation, wherein the data processing system comprises means for performing the method according to claim 4.

18. A computer program for traffic flow simulation which can be loaded and executed on a data processing unit and which when executed performs the method claimed in claim 4.

\* \* \* \* \*